United States Patent
Muchherla et al.

(10) Patent No.: US 11,688,483 B2
(45) Date of Patent: *Jun. 27, 2023

(54) MANAGING BLOCK RETIREMENT FOR TEMPORARY OPERATIONAL CONDITIONS

(71) Applicant: Micron Technology, Inc., Boise, ID (US)

(72) Inventors: Kishore Kumar Muchherla, Fremont, CA (US); Sampath K. Ratnam, Boise, ID (US); Scott A. Stoller, Boise, ID (US); Preston A. Thomson, Boise, ID (US); Kevin R. Brandt, Boise, ID (US); Marc S. Hamilton, Eagle City, ID (US); Christopher S. Hale, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/521,785

(22) Filed: Nov. 8, 2021

(65) Prior Publication Data

US 2022/0068422 A1 Mar. 3, 2022

Related U.S. Application Data

(63) Continuation of application No. 16/660,483, filed on Oct. 22, 2019, now Pat. No. 11,170,866.

(51) Int. Cl.
*G11C 29/00* (2006.01)
*G11C 29/38* (2006.01)
*G11C 29/44* (2006.01)

(52) U.S. Cl.
CPC .............. *G11C 29/38* (2013.01); *G11C 29/44* (2013.01)

(58) Field of Classification Search
None
See application file for complete search history.

(56) References Cited

U.S. PATENT DOCUMENTS

| | | | |
|---|---|---|---|
| 2011/0173484 A1* | 7/2011 | Schuette ................ | G11C 29/00 714/E11.029 |
| 2011/0219203 A1* | 9/2011 | Nurminen ............. | G11C 11/406 711/E12.001 |
| 2014/0068360 A1* | 3/2014 | Lai ......................... | G11C 29/10 714/718 |

(Continued)

OTHER PUBLICATIONS

D. Defour and E. Petit, "GPUburn: A system to test and mitigate GPU hardware failures," 2013 International Conference on Embedded Computer Systems: Architectures, Modeling, and Simulation (SAMOS), Agios Konstantinos, Greece, 2013, pp. 263-270, doi: 10.1109/SAMOS.2013.6621133. (Year: 2013).*

(Continued)

*Primary Examiner* — Daniel F. McMahon
(74) *Attorney, Agent, or Firm* — Lowenstein Sandler LLP

(57) ABSTRACT

A processing device in a memory system detects a data loss occurrence in a block of a memory component. The processing device further designates the block as a quarantined block, performs a stress test on the block, and depending on whether the stress test on the block satisfies a testing criterion, either designates the block as usable by the memory component or retires the block of the memory component.

20 Claims, 6 Drawing Sheets

(56) References Cited

U.S. PATENT DOCUMENTS

2016/0034206 A1* 2/2016 Ryan .................... G06F 3/0605
711/103
2016/0054937 A1* 2/2016 Tuers ..................... G11C 7/04
711/103
2019/0130990 A1* 5/2019 Liu ....................... G11C 29/10

OTHER PUBLICATIONS

J. Kaczmarek and M. Wrobel, "Modern approaches to file system integrity checking," 2008 1st International Conference on Information Technology, 2008, pp. 1-4, doi: 10.1109/INFTECH.2008.4621669. (Year: 2008).

* cited by examiner

MANAGING BLOCK RETIREMENT FOR TEMPORARY OPERATIONAL CONDITIONS

RELATED APPLICATIONS

This application is a continuation application of co-pending U.S. patent application Ser. No. 16/660,483, filed Oct. 22, 2019, which is herein incorporated by reference.

TECHNICAL FIELD

Embodiments of the disclosure relate generally to memory sub-systems, and more specifically, relate to managing block retirement for temporary operational conditions.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
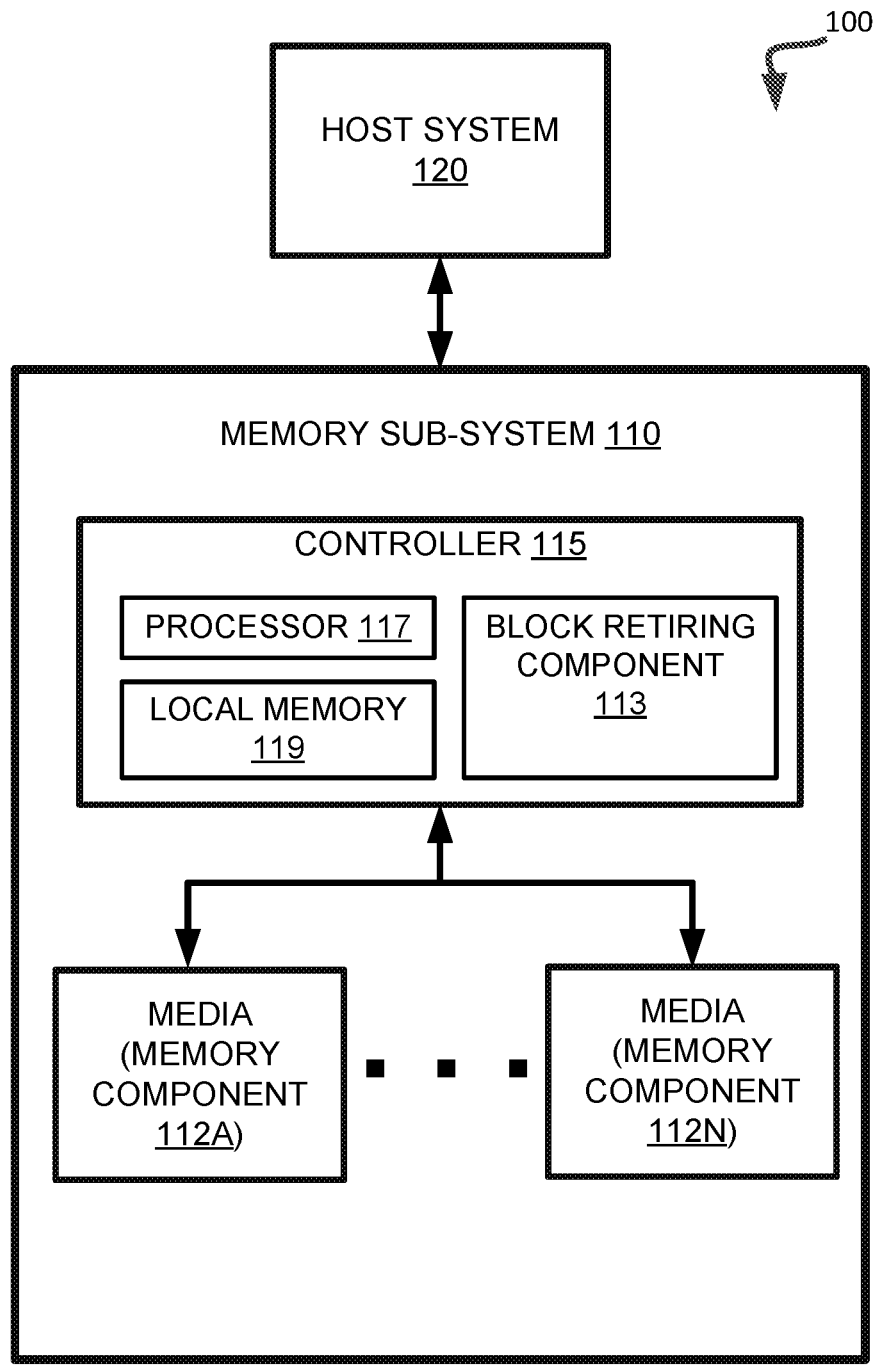
FIG. 1 illustrates an example computing environment that includes a memory sub-system in accordance with some embodiments of the present disclosure.

Aspects of the present disclosure are directed to systems and methods for managing block retirement for temporary operational conditions in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

A memory device can be a non-volatile memory device. A non-volatile memory device is a package of one or more dice. Each die can consists of one or more planes. Planes can be groups into logic units (LUN). For some types of non-volatile memory devices (e.g., NAND devices), each plane consists of a set of physical blocks. Each block consists of a set of pages. Each page consists of a set of memory cells, which store bits of data. The memory sub-system is expected to operate within certain specifications designed to allow for proper storing and retrieving of the host data at the memory sub-system. When the memory sub-system operates outside the design specifications, certain blocks may return errors in the form of data loss. Data loss of a block may occur when a read operation of a previously written bits of data to the block fails and a subsequent system-level error handling flow fails to recover the data. In one example, the memory sub-system can experience data loss when design specifications of the memory sub-system are violated by a customer (e.g. while testing the memory sub-system). For example, the memory sub-system may be operating under an operating temperature that is in violation of the design specification, potentially causing a cross-temperature failure to occur. A cross temperature failure can occur when operating the memory sub-system in an environment with widely varying temperatures such that a memory cell is programed at a first temperature and later read at a significantly different temperature. In another example, violation of the design specifications may occur when the memory sub-system is stored at an abnormal power-off storage temperature for an extended period of time (e.g. leaving a memory drive in storage at 55 degrees Centigrade for several months when the allowable power-off storage temperature is 30 degrees Centigrade).

Because the data loss caused by the design specification violation cannot be recovered by the error handing mechanism, blocks that suffered the data loss may be retired by the memory sub-system because the data loss is presumed to be an indication of a defective block. A "retired block" refers to a block that is permanently marked as unusable, such that it cannot be used by the memory sub-system for storing host data for the lifetime of the block. Therefore, retiring blocks due to temporary operational conditions, as is the case when operating the memory sub-system under conditions in violation of the design specification, may not be desirable when the memory components itself is otherwise healthy and not defective. Thus, the block retiring mechanism needs to incorporate mitigation processes, such that data loss due to temporary abnormal operational conditions do not lead to retiring healthy blocks.

Conventionally, popular practices of managing block retirement include executing a system-level error handling procedure as an attempt to recover data loss before retiring the block. For example, if the error handling procedure is able to recover the data loss in the block, the block may not be flagged as retired. If, on the other hand, the error handling procedure is not able to recover the data loss, the block may be flagged as retired. While using an error handling procedure may mitigate block retiring in some cases, the error handling procedure may still fail to recover data loss caused by temporary operational conditions, thus may not be able to mitigate block retiring due to the temporary operational conditions even when the block itself is not inherently defective. For example, when a memory sub-system operates under a cross-temperature that is in violation of the design specification, a block of the memory sub-system may experience a data loss that triggers the error handing procedure. While attempting to recover the data loss, the error handling procedure may not be able to recognize that the current abnormal cross-temperature is temporary, thus, if the error handling procedure fails to recover the data loss, the block may be flagged as retired. Retiring the block in this case may not be desirable because the block may perform properly if operated under normal cross-temperature that is in conformance with the design specifications. Accordingly, a different technique for managing block retirement may be preferred to improve performance and reduce data loss, while ensuring that healthy blocks are not prematurely retired.

Aspects of the disclosure address the above and other deficiencies by implementing systems and methods for managing block retirement for temporary operational conditions. The memory sub-system can initially detect a data loss occurrence in a block that cannot be recovered by a system-level error handling procedure. The memory sub-system can then identify a behavioral criterion causing the data loss occurrence in the block. In certain implementations, the behavioral criterion may be whether one of a number of failure mechanisms satisfies a predetermined threshold criterion. The failure mechanisms may include abnormal operational conditions related to cross-temperature, program/erase cycles (hereinafter, P/E cycles), read disturb of the block, or a combination thereof. Managing block retirement under temporary operational conditions can ensure that the drive remains functional when design specification is violated. It can further protect against a write-protect impact due to occasional usage anomalies by customers. A write protect state occurs when the memory sub-system is operating under a read-only condition due to an uncorrectable error. Without proper management of block retirement events, chances of the memory sub-system entering into a write protect state can increase rite protect state. Moreover, managing block retirement under temporary operational conditions can also protect against minor firmware bugs that may trigger unnecessary block retirement events.

In certain implementations, once a behavioral criterion has been identified, the memory sub-system can add the block to a watch list, such that the block may be monitored for further data loss events. In one example, the block may be added to the watch list by incrementing a watch list counter associated with the block in response to the occurrence of the behavioral criterion. While in the watch list, the memory bock can be monitored for abnormal behavior (e.g. further data loss events) while continuing to be usable by the memory sub-system for storing host data. For example, the watch list counter for the block can be incremented each time a data loss event occurs due to an abnormal cross-temperature of the memory cell corresponding to the block. Responsive to determining that the value of the watch list counter of the block exceeds a predetermined threshold, the memory sub-system can designate the block as a quarantined block, by adding the block to a quarantine queue.

A quarantine queue can be maintained by the memory sub-system to perform certain stress tests on quarantined blocks to assess the health of the quarantined blocks. Stress tests of quarantined blocks may include a cross-temperature test, a P/E cycles test, a read disturb test of the block, or a combination thereof. While in the quarantine queue, a block can be designated as unusable by the memory component for storing host data, for a predetermined time period. Subsequent to designating the block as quarantined, the memory sub-system may perform a stress test of the block, using test data, to assess the health of the block based on the result of the stress test. As will be described in more detail herein, in one implementation, if the stress test result of the block does not meet a testing criterion, the memory sub-system can determine that the block is defective and can retire the block. If, on the other hand, the memory sub-system determines that the first stress test result satisfies the testing criterion, the memory sub-system can designate the block as an un-quarantined block, thus allowing the block to exit the quarantine queue. The block can subsequently be treated as a healthy block by the memory sub-system and can be used for storing host data.

FIG. 1 illustrates an example computing environment 100 that includes a memory sub-system 110 in accordance with some embodiments of the present disclosure. The memory sub-system 110 can include media, such as memory components 112A to 112N (also hereinafter referred to as "memory devices"). The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs), multi-level cells (MLCs), triple level cells (TLCs), or quad-level cells (QLCs). In some embodiments, a particular memory component can include both an SLC portion and a MLC portion of memory cells. Each of the memory cells can store one or more bits of data used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or blocks that can refer to a unit of the memory component used to store data. The blocks can be further grouped into one or more planes on each of memory components 112A to 112N, where operations can be performed on each of the planes concurrently. Corresponding blocks from different planes can be associated with one another in a stripe than spans across multiple planes.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

In one implementation, the memory sub-system 110 includes a block retiring component 113 that can be used to manage block retirement in one or more of memory components 112A to 112N of memory sub-system 110, by monitoring and testing the operational conditions of blocks. In one implementation, block retiring component 113 can detect a data loss occurrence in a block that cannot be recovered by a system-level error handling procedure. Block retiring component 113 can then identify a behavioral criterion causing the data loss occurrence in the block. In certain implementations, the behavioral criterion may be whether one of a number of failure mechanisms satisfies a predetermined threshold criterion. For example, if a failure mechanism exceeds a predetermined threshold then it satisfies the threshold criterion. Similarly, when a failure mechanism satisfies a predetermined threshold criterion, then the failure mechanism exceeds the predetermined threshold. The failure mechanisms may include abnormal operational conditions related to cross-temperature, P/E cycles, read disturb of the block, or a combination thereof. A cross temperature failure can occur when operating the memory sub-system in an environment with widely varying temperatures such that a memory cell is programed at a given temperature and later read at a significantly different temperature. An issue with the number of P/E cycles may arise when memory cells within the memory sub-system lose charge over time due to a large number of P/E cycles operated on the respective memory cell. A read disturb issue occurs when a read to a particular location (e.g., one row of a memory cell of a block) of the memory sub-system impacts the threshold voltages of unread adjacent locations (e.g., different rows of the same block).

Upon identifying a behavioral criterion block retiring component 113 can add the block to a watch list, such that the block may be monitored for further data loss events. In one example, block retiring component 113 can add the block to the watch list by incrementing a watch list counter associated with the block in response to the occurrence of the behavioral criterion. Responsive to determining that the value of the watch list counter of the block satisfies a predetermined threshold criterion, block retiring component 113 can designate the block as a quarantined block, by adding the block to a quarantine queue and flagging the block as unusable by memory sub-system 110 for storing host data.

The quarantine queue can be maintained by block retiring component 113 to perform certain stress tests on quarantined blocks to assess the health of quarantined blocks. Stress tests of quarantined blocks may include a cross-temperature test, a P/E cycles test, a read disturb test of the block, or a combination thereof. Subsequent to designating the block as quarantined, block retiring component 113 may perform a stress test of the block to assess the health of the block based on the results of the stress test. In one implementation, the testing criterion may be comparing a first stress test result of the block with a second stress test result of a healthy block and determining whether the first stress test result is within an expected variance from the second stress test result of the healthy block. If the first stress test results of the block does not meet the testing criteria, block retiring component 113 can retire the block. If, on the other hand, block retiring component 113 determines that the first stress test result satisfies the testing criterion, the block retiring component 113 can designate the block as an un-quarantined block, thus allowing the block to exit the quarantine queue. The block can subsequently be treated as a healthy block by memory sub-system 110 and can be used for storing host data.

Figure 2:
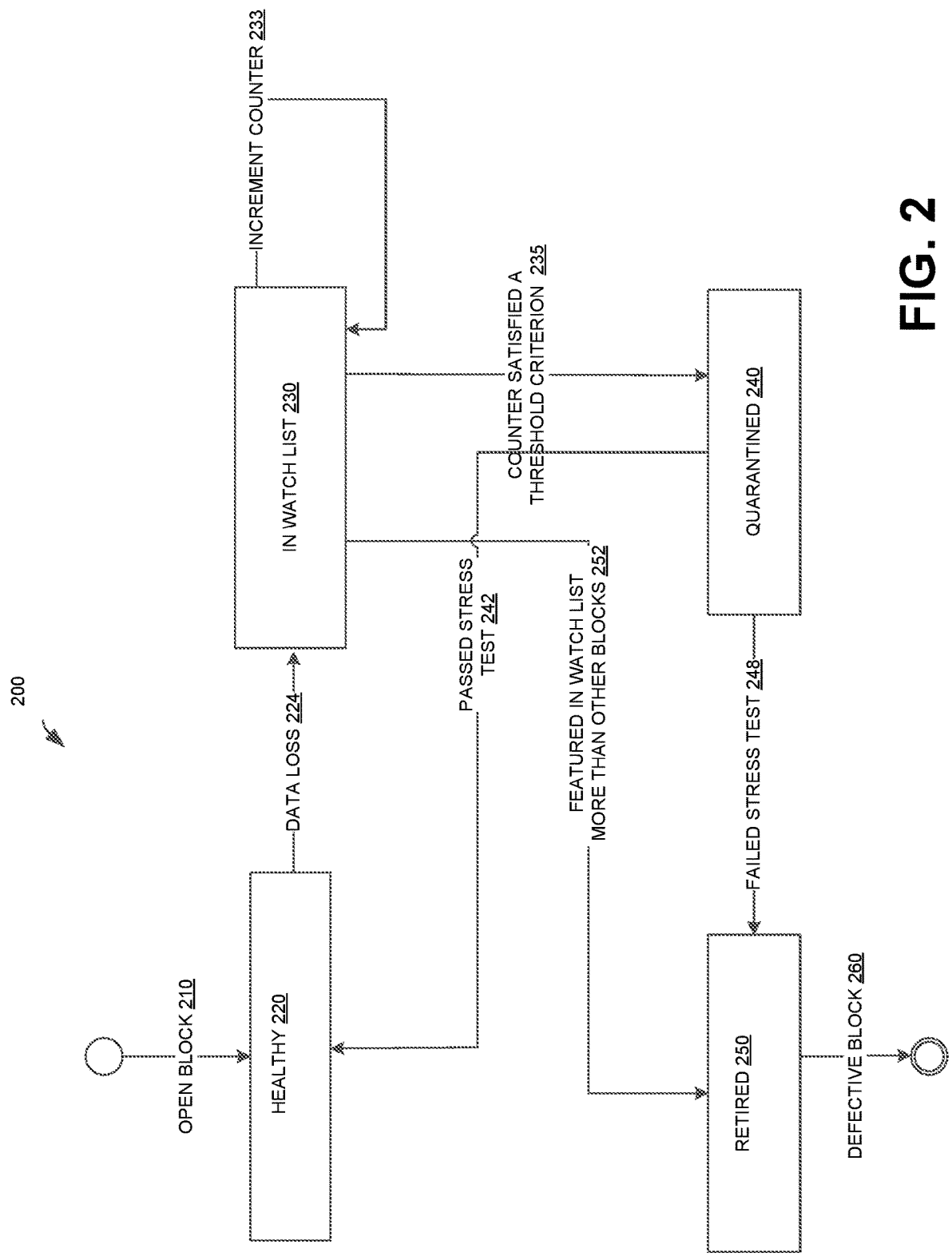
FIG. 2 is a schematic sequence diagram illustrating the various states that a block can occupy at a given point in time in accordance with some embodiments of the present disclosure.

FIG. 2 is a schematic sequence diagram 200 illustrating the various states that a block can occupy at any given time in accordance with some embodiments of the present disclosure. In one implementation, each memory component 112A-N of FIG. 1 can contain hundreds of blocks. Block 210 can be assigned healthy state 220 when it is first opened by memory sub-system 110. In certain implementations, healthy state 220 may indicate that the block is not flagged for monitoring in a watch list or for stress testing in a quarantine queue by memory sub-system 110. At operation 224, block 210 may experience a data loss event that can be detected by memory sub-system 110. Data loss may occur when a read operation of a previously written bits of data to a block fails and a subsequent system-level error handling flow fails to recover the data. In one example, memory sub-system 110 can experience data loss when design specifications of the memory sub-system are violated by a customer (e.g. while testing the memory sub-system). In one implementation, the memory sub-system may be operating under a cross-temperature that is in violation of the design specification, causing a cross-temperature failure to occur. Subsequent to detecting the data loss in block 210, memory sub-system 110 can identify a behavioral criterion causing the data loss occurrence in block 210. In certain implementations, the behavioral criterion may be whether a failure mechanism satisfied a predetermined threshold criterion. The failure mechanisms may include abnormal operational conditions related to cross-temperature, P/E cycles, read disturb of the block 210, or a combination thereof.

Memory sub-system 110 can then assign block 210 to "in watch list" state 230. "In watch list" state 230 causes memory sub-system 110 to monitor block 210 for further occurrences of the behavioral criterion that caused the data loss event, or other behavioral criteria. In one example, memory sub-system 110 can assign block 210 to "in watch list" state 230 by incrementing a watch list counter associated with block 210 at operation 233. The watch list counter associated with block 210 can be incremented for each occurrence of a behavioral criterion of block 210. Further, block 210 can continue to be usable by memory sub-system 110 for storing host data while in the "in watch list" state 230. For example, block 210 may be assigned "in watch list" state 230 due to an abnormal cross-temperature of the memory cell corresponding to block 210. During the next power-on event of memory sub-system 110, cross-temperature of the memory cell may be measured and if abnormal cross-temperature is detected again the watch list counter of block 210 can be incremented again.

At operation "featured in watch list more than other blocks" 252, memory sub-system 110 can detect that block 210 featured in "in watch list" state 230 at a significantly higher frequency than other blocks within memory sub-system 110 (e.g. by comparing the watch list counter associated with block 210 with that of other blocks within memory sub-system 110). Memory sub-system 110 can then determine that the data loss in block 210 is not due to the abnormal operational conditions of memory sub-system 110 since other blocks within sub-system 110 did not experience that same rate of data loss. Memory sub-system 110 can then determine that block 210 is not healthy and can flag block 210 as retired by assigning retired state 250 to it. When block 210 is in retired state 250, it can be presumed to be a defective block 260 for the duration of its lifetime, and memory sub-system 110 may not use block 210 for storing host data.

At operation "counter satisfied a threshold criterion" 235, memory sub-system 110 can detect that block 210 featured in "in watch list" state 230 for a number of times satisfying a predetermined threshold criterion (e.g. by examining the watch list counter associated with block 210). For example, the value of the watch list counter can satisfy the threshold criterion when the watch list counter exceeds the predetermined threshold. Responsive to determining that the value of the watch list counter of block 210 satisfies the predetermined threshold criterion, memory sub-system 110 can assign block 210 to quarantined state 240. In one example, memory sub-system 110 can assign block 210 to quarantined state 240 by adding block 210 to a quarantine queue. A quarantine queue can be maintained by memory sub-system 110 to perform certain stress tests on quarantined blocks to assess the health of the quarantined blocks. Stress tests of quarantined blocks may include a cross-temperature test, a P/E cycles test, a read disturb test of the block, or a combination thereof. In one example, stress tests of quarantined blocks may run during an idle time of memory sub-system 110 to avoid introducing latencies to the memory drive. Further, while in quarantined state 240, block 210 can be designated as unusable by memory sub-system 110 for storing host data.

Subsequent to designating block 210 as quarantined, the memory sub-system may perform a stress test on block 210 to assess the health of the block based on the results of the stress test. For example, memory sub-system 110 may apply self-heating mechanism to momentarily increase the temperature of the memory drive and then observe the behavior of block 210 as a result of this increase in operating temperature. The stress test result of the block may then be evaluated to determine whether the stress test results of the block satisfy a testing criterion.

In one implementation, the testing criterion may be comparing a first stress test result of block 210 with a second stress test result of a healthy block and determining whether the first stress test result is within an expected variance from the second stress test result of the healthy block. In one example, the second stress test result of the healthy block may be retrieved from a predetermined storage location where test results may be stored for benchmarking purposes. The expected variance can be an expected percentile of deviation from the benchmarking test result of the healthy block.

At "failed stress test" operation 248, memory sub-system 110 can determine that the first stress test result of block 210 is not within the expected variance from the second stress test result of the healthy block, thus can assign retired state 250 to block 210. In one example, if the threshold voltage of a word-line corresponding to block 210 is found to be higher than the threshold voltage of a second word-line corresponding to the healthy block by more than 20%, memory sub-system 110 can determine that 20% is not within the expected variance from the healthy test results. Memory sub-system 110 can then determine that block 210 is not healthy and can flag block 210 as retired by assigning retired state 250 to it. When block 210 is in retired state 250, it can be presumed to be a defective block 260 for the duration of its lifetime, and memory sub-system 110 may not use block 210 for storing host data.

At "passed stress test" operation 242, if memory sub-system 110 determines that the first stress test result of block 210 is within the expected variance from the second stress test result of the healthy block, then memory sub-system 110 can designate block 210 as an un-quarantined block by assigning healthy state 220 to it, thus allowing block 210 to exit the quarantine queue. For example, if the threshold voltage of a word-line corresponding to block 210 is found to be slightly higher (by 5%) than the threshold voltage of a second word-line corresponding to the healthy block, memory sub-system 110 can determine that block 210 is healthy and can assign healthy state 220 to block 210. In another example, if the number of PIE cycles of block 210 is found to be less than a predetermined threshold of acceptable P/E cycles, then memory sub-system 110 can similarly determine that block 210 is healthy and can assign healthy state 220 to block 210. Block 210 can subsequently be treated as a normal block by memory sub-system 110 and can be used for storing host data.

Figure 3:
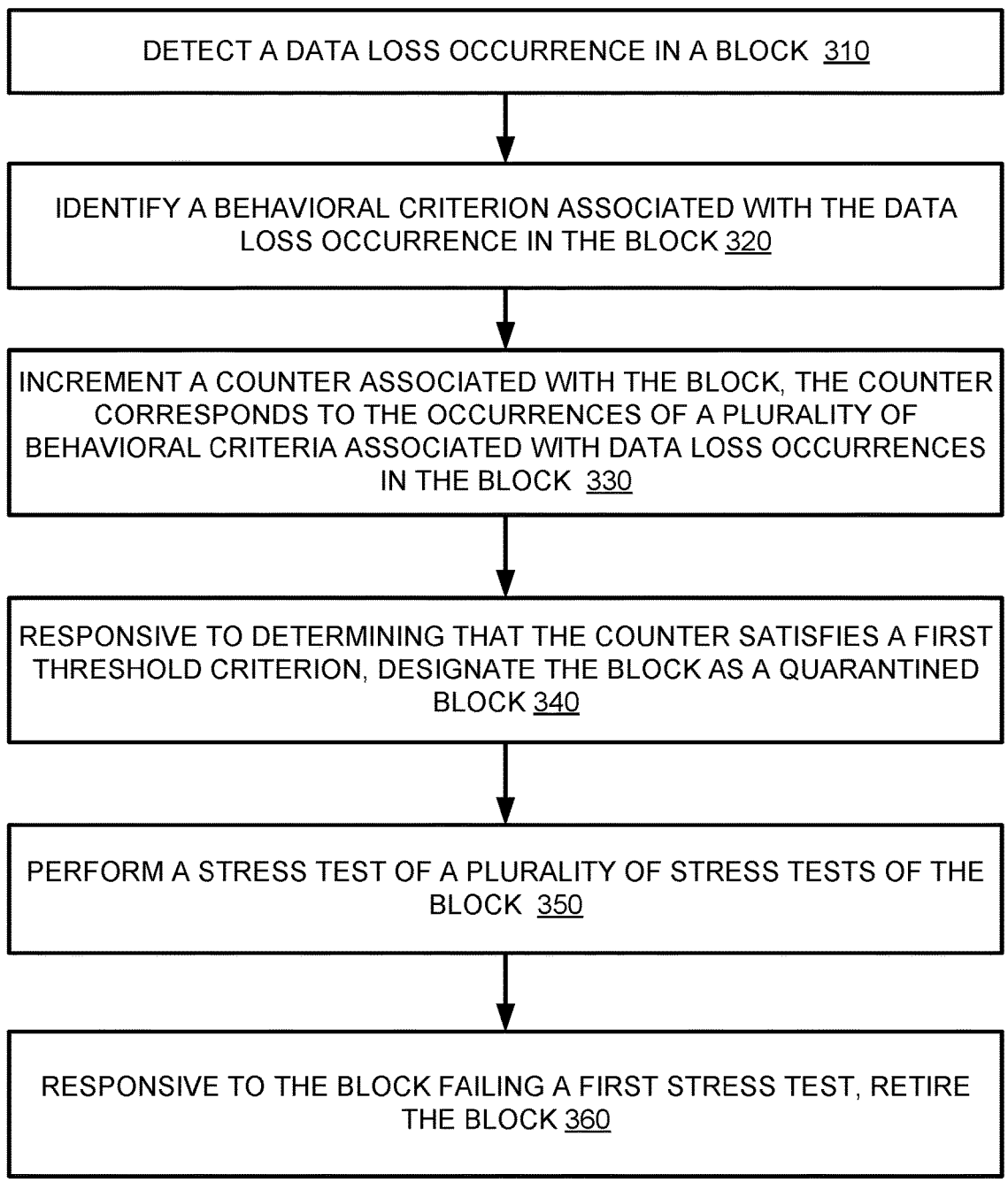
FIG. 3 is a flow diagram of an example method for managing block retirement for temporary operational conditions in accordance with some embodiments of the present disclosure.

FIG. 3 is a flow diagram of an example method managing block retirement for temporary operational conditions, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by block retiring component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device detects a data loss occurrence in a block. Data loss may occur when a read operation of a previously written bits of data to a block fails and a subsequent system-level error handling flow fails to recover the data. In one example, the processing device can report data loss when design specifications of the memory sub-system are violated by a customer (e.g. while testing the memory sub-system).

At operation 320, the processing device can identify a behavioral criterion causing the data loss occurrence in the block. In certain implementations, the behavioral criterion may be whether one of a number of failure mechanisms satisfied a predetermined threshold criterion (e.g. by having a value that exceed the predetermined threshold). The failure mechanisms may include abnormal operational conditions related to cross-temperature, program/erase cycles (hereinafter, P/E cycles), read disturb of the block, or a combination thereof, as explained in more details herein above.

When a behavioral criterion has been identified, the processing device, at operation 330, can increment a watch list counter associated with the block in response to the occurrence of the behavioral criterion. In one implementation, incrementing the watch list counter can cause the block to be added to a watch list, such that the block may be monitored for further behavioral criteria. While in the watch list, the memory bock can be monitored for abnormal behavior (e.g. further data loss events) while continuing to be usable by the memory sub-system for storing host data. The watch list counter for the block can be incremented each time a data loss event occurs in the block.

At operation 340, responsive to determining that the value of the watch list counter of the block satisfies a predetermined threshold criterion, the processing device can assign a quarantined state to the block, thus adding the block to a quarantine queue. For example, a block that features in the watch list for ten times can be added to the quarantine queue. A quarantine queue can be maintained by the processing device to perform certain stress tests on quarantined blocks to assess the health of the quarantined blocks, while flagging the block as unusable for storing host data, as explained in more details herein above.

Subsequent to designating the block as quarantined, the processing device at operation 350 can perform a stress test on the block to assess the health of the block based on the results of the stress test. The stress test results of the block may then be evaluated to determine whether the stress test results of the block satisfy a testing criterion. In one implementation, the testing criterion may be comparing a first stress test result of the block with a second stress test result of a healthy block and determining whether the first stress test result is within an expected variance from the second stress test result of the healthy block, as explained in more details herein above.

Lastly, at operation 360, responsive to determining that the stress test result of the block satisfies a predetermined threshold criterion, the processing device can retire the block by assigning a retired state to the block. For example, if a threshold voltage of a word-line corresponding to the block is found to be higher than a threshold voltage of a second word-line corresponding to the healthy block by more than 20%, the processing device can determine that the block is not healthy and can retire the block.

Figure 4:
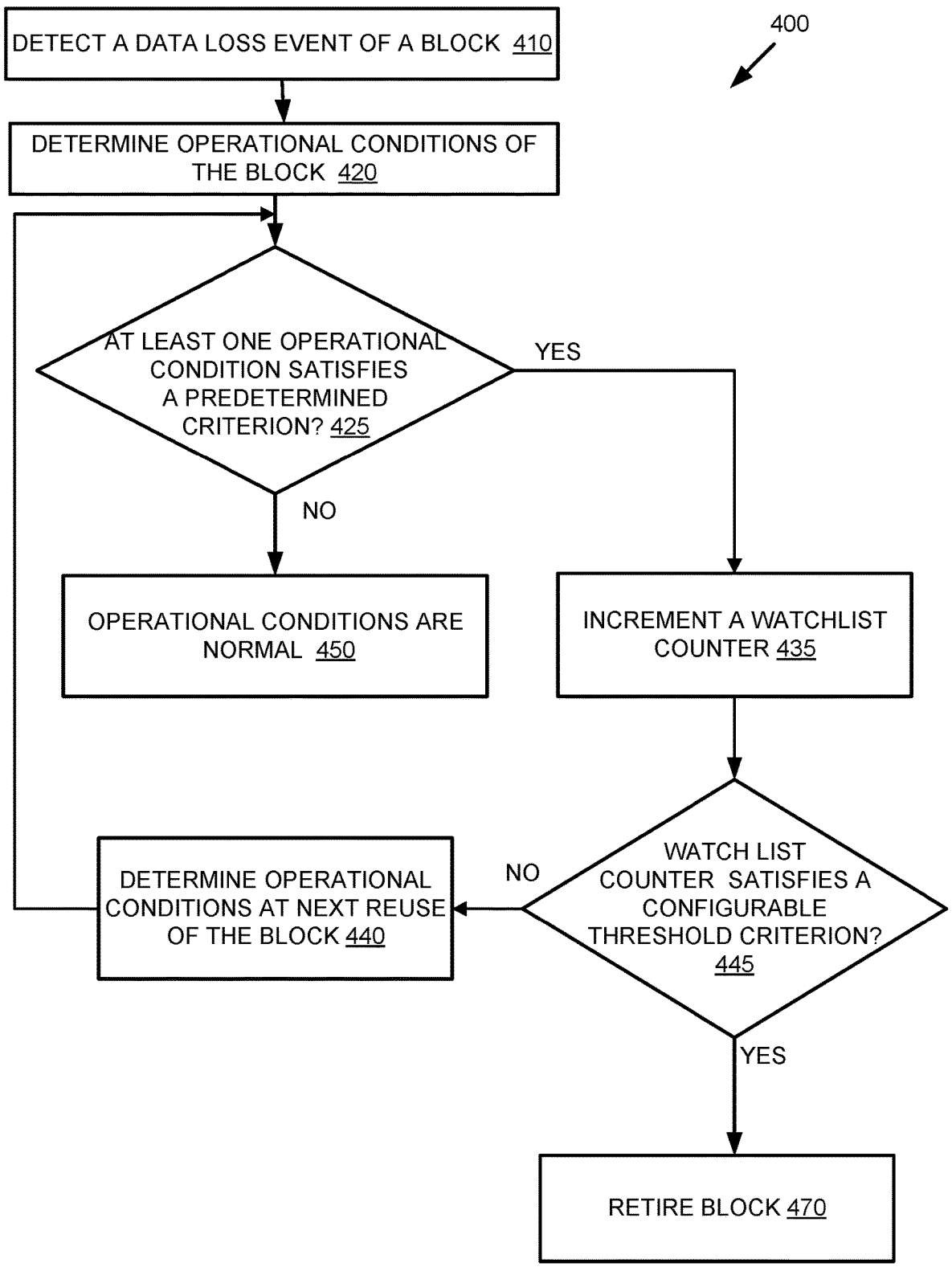
FIG. 4 is a flow diagram of an example method for adding blocks causing data loss to a watch list before retiring the block, in accordance with some embodiments of the present disclosure.

FIG. 4 is a flow diagram of an example method for adding blocks causing data loss to a watch list before retiring the block, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by block retiring component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device detects a data loss occurrence in block 210, where data loss fails to be recovered by a system-level error handling mechanism, as explained in more details herein above. The processing device can determine one or more operational conditions of block 210, at operation 420, to determine whether there have been behavioral criteria associated with the data loss occurrence in block 210. In one example, the processing device may determine whether the number of P/E cycles satisfies a predetermined criteria, whether a cross-temperature failure had occurred, etc. If the processing device determines that at least one operational condition satisfies a predetermined criterion, at block 425, thus determining that at least one failure had occurred, the processing device can flag block 210 for further monitoring (e.g. by adding to a watch list).

At operation 435, when at least one operational condition is found to satisfy a predetermined criterion, the processing device can increment a watch list counter associated with block 210 in response to the one or more operational condition satisfying the predetermined criteria. In one implementation, incrementing the watch list counter can cause the block to be added to a watch list, such that the block may be monitored for further behavioral criteria. While in the watch list, memory bock 210 can be monitored for abnormal behavior (e.g. further data loss events) while continuing to be usable by the processing device for storing host data. In one example, the watch list counter for block 210 can be incremented each time an operational condition satisfies the predetermined criterion (e.g. when measured at power-on time of the block).

If, on the other hand, operational conditions of block 210 do not satisfy the predetermined criteria, the processing device can, at operation 450, determine that block 210 can be operating within the normal operational conditions. In certain implementation, the processing device can reset the watch list counter associated with block 210 to zero, thus ending the monitoring process of block 210 and assigning healthy state to block 210. In other implementations, the processing device can determine that a different operational condition (e.g. cross-temperature, read disturb, P/E cycles, or data retention) of block 210 should be evaluated for monitoring.

At operation 445, the processing device can determine whether the value of the watch list counter of block 210 satisfies a configurable threshold criterion. In certain implementations, if the value of the watch list counter of block 210 exceeds a configurable threshold, then it satisfies the threshold criterion, and vice versa. For example, the processing device may determine that block 210 can be retired after featuring in the watch list significantly more times than other blocks within the memory sub-system. In this case, the block can be retired because the memory sub-system can determine that the repeated data loss events of block 210 are not due to temporary operational conditions that are applicable to all blocks. If the value of the watch list counter of block 210 satisfies the configurable threshold criterion, the processing device can retire block 210, at operation 470, by assigning a retired state to block 210.

Alternatively, at operation 440, if the processing device determines that the value of the watch list counter of block 210 does not satisfy the configurable threshold criterion, the processing device may continue to monitor block 210 by keeping it in the watch list. In one example, the processing device can determine the operational conditions of block 210 at the next reuse of block 210. A next reuse of block 210 can be the next power-on event of memory sub-system 110. The processing device may then proceed to evaluating the operational conditions against the predetermined criteria at operation 425 as described herein above.

Figure 5:
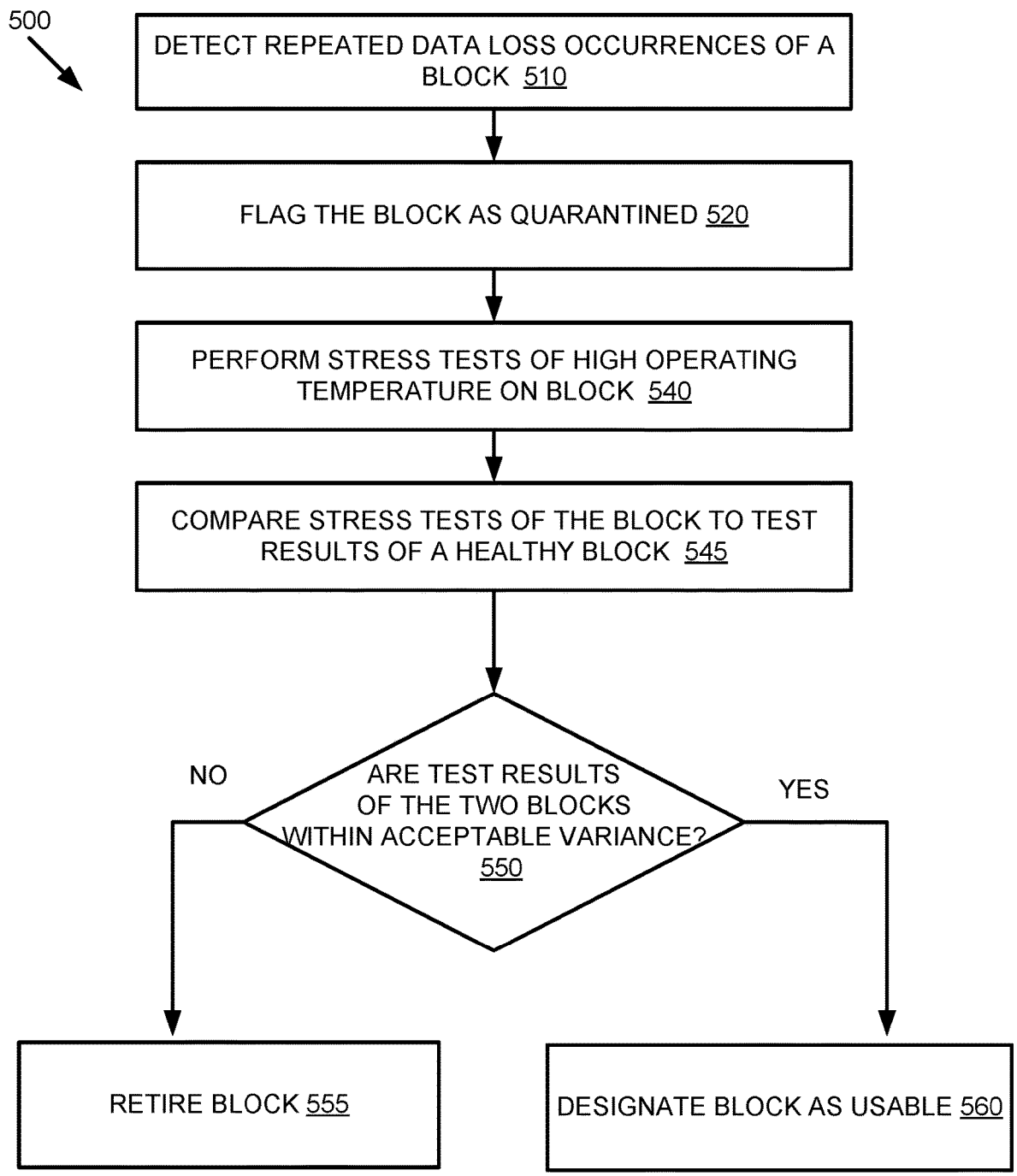
FIG. 5 is a flow diagram of an example method for adding blocks causing data loss to a quarantine queue before retiring the block, in accordance with some embodiments of the present disclosure.

FIG. 5 is a flow diagram of an example method for flagging blocks causing data loss as quarantined before retiring the block, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by block retiring component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device detects a number of data loss occurrences in block 210, where data loss occurrences fail to be recovered by a system-level error handling mechanism. In certain implementations, data loss occurrences may be caused by one or more failure mechanisms exceeding predetermined thresholds. The failure mechanisms may include abnormal operational conditions related to cross-temperature, P/E cycles, read disturb of the block, or a combination thereof, as explained in more details herein above.

At operation 520, responsive to detecting the data loss events, the block retiring components 113 can flag block 210 as quarantined by assigning quarantined status to block 210. Block retiring components 113 can maintain a quarantine queue to perform certain stress tests on quarantined blocks to assess the health of the quarantined blocks, while flagging the block as unusable for storing host data, as explained in more details herein above.

Subsequent to assigning the quarantined state to block 210, at operation 540, block retiring component 113 can perform a stress test of high operating temperature on block 210. In one example, block retiring component 113 may apply self-heating mechanism to momentarily increase the temperature of memory sub-system 110 and then observe the behavior of block 210 as a result of this increase in the operating temperature. The stress test result of block 210 may then be evaluated to determine whether the stress test results of the block satisfy a testing criterion (e.g. by comparing the stress test result with another stress test result of a healthy block).

At operation 545, block retiring component 113 can compare a first stress test result of block 210 with a second stress test result of a healthy block. In one example, the second stress test result of the healthy block may be retrieved from a predetermined storage location where the test result may have been previously stored for benchmarking purposes. Block retiring component 113 then determines, at operation 550, whether the first stress test result is within an acceptable variance from the second stress test result of the healthy block, as explained in more details herein above. For example, the high operating temperature of memory sub-system 110 may cause an increase in threshold voltage of a word-line corresponding to a block. Therefore, if the threshold voltage of a word-line corresponding to block 210 is found to be higher than the threshold voltage of a second word-line corresponding to the healthy block by more than 20%, the block retiring component 113 can determine that 20% is not an acceptable variance and thus can flag block 210 as not usable.

At operation 555, if block retiring component 113 determines that the first stress test result of block 210 is not within an acceptable variance from the second stress test result of the healthy block, block retiring component 113 can cause block 210 to retire by assigning retired state to block 210. As described in more details herein above, a retired block 210 may not be used for storing host data.

At operation 560. If, on the other hand, block retiring component 113 determines that the first stress test result of block 210 is within an acceptable variance from the second stress test result of the healthy block, block retiring component 113 can cause block 210 to exit the quarantine queue by assigning healthy state to block 210. Block 210 may then be used for storing host data, as explained in more details herein above.

Figure 6:
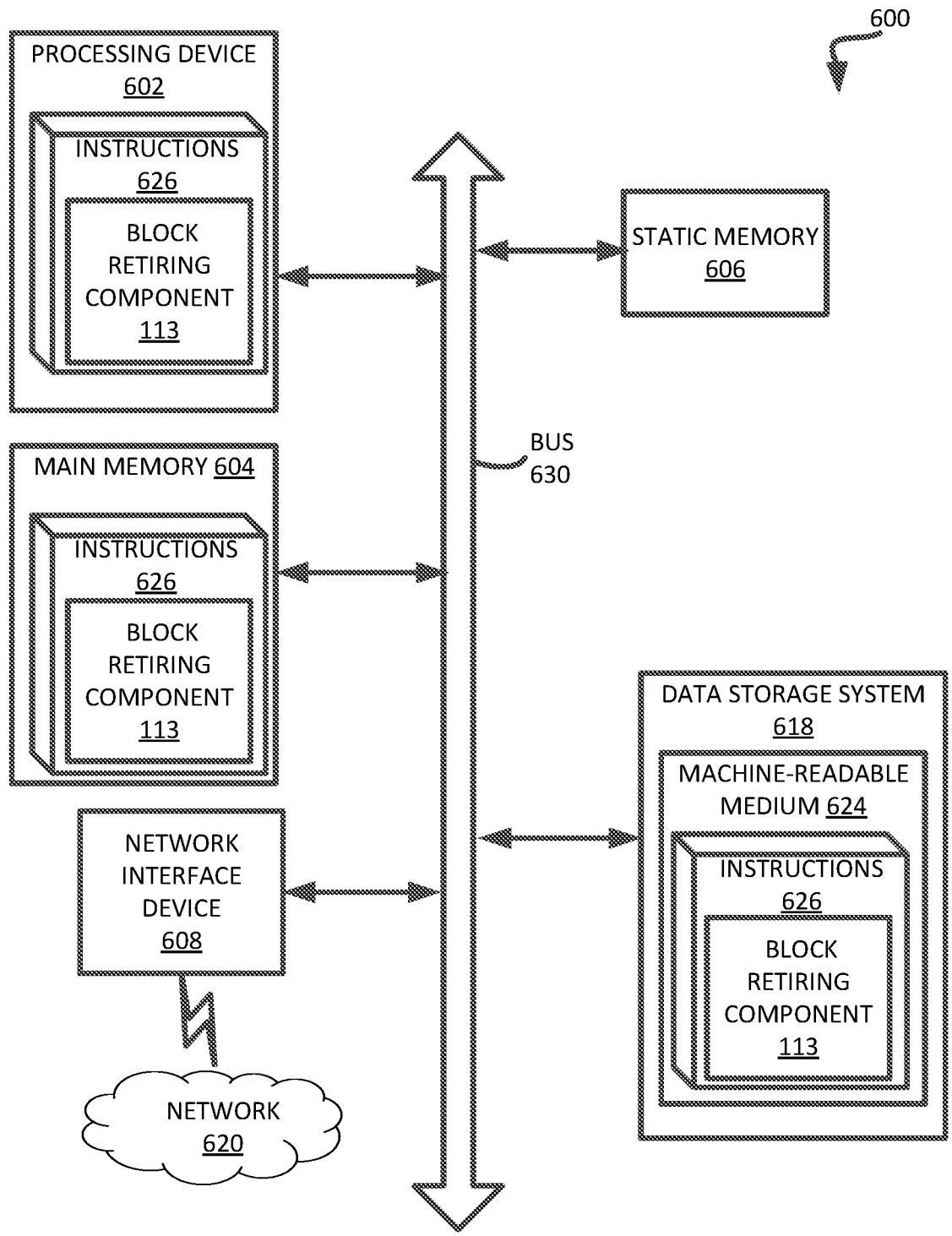
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to block retiring component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to block retiring component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled with the memory component, to perform operations comprising:
detecting a data loss occurrence in a block of the memory component;
designating the block as a quarantined block;
performing a stress test on the block of the memory component; and
depending on whether the stress test on the block of the memory component satisfies a testing criterion, either designating the block as usable by the memory component or retiring the block of the memory component, wherein the testing criterion is based on a variance of a first stress test result of the stress test on the block from a stored second stress test result of a second stress test on a second block previously designated as usable by the memory component.

2. The system of claim 1, wherein designating the block as the quarantined block comprises designating, for a predetermined time period, the block as unusable by the memory component for storing host data.

3. The system of claim 1, wherein designating the block as usable by the memory component comprises:
designating the block as a healthy block; and
designating the block as usable by the memory component for storing host data.

4. The system of claim 1, wherein the operations further comprise:
identifying a behavioral criterion associated with the data loss occurrence in the block of the memory component; and
incrementing a counter associated with the block in response to the identified behavioral criterion, wherein a value of the counter corresponds to a number of occurrences of a plurality of behavioral criteria causing data loss occurrences in the block,
wherein the block is designated as the quarantined block responsive to determining that the value of the counter satisfies a first threshold criterion.

5. The system of claim 4, wherein incrementing the counter associated with the block comprises monitoring the behavioral criterion while continuing to designate the block as usable by the memory component for storing host data.

6. The system of claim 4, wherein the behavioral criterion comprises a failure mechanism satisfying a second threshold criterion, the failure mechanism comprising at least one of cross-temperature, program/erase cycles, or read disturb with respect to the block.

7. The system of claim 1, wherein the stress test comprises at least one of cross-temperature test, program/erase cycles test, or read disturb test of the block.

8. The system of claim 1, wherein the operations further comprise:
determining that the stress test performed on the block of the memory component does not satisfy the testing criterion, the determining comprising:
comparing the first stress test result with the stored second stress test result; and
determining that the first stress test result of the block is outside an expected variance from the stored second stress test result of the second block.

9. A method comprising:
detecting, by a processing device, a data loss occurrence in a block of a memory component;
designating the block as a quarantined block;
performing a stress test on the block of the memory component; and
depending on whether the stress test on the block of the memory component satisfies a testing criterion, either designating the block as usable by the memory component or retiring the block of the memory component, wherein the testing criterion is based on a variance of a first stress test result of the stress test on the block from a stored second stress test result of a second stress test on a second block previously designated as usable by the memory component.

10. The method of claim 9, wherein designating the block as the quarantined block comprises designating, for a predetermined time period, the block as unusable by the memory component for storing host data.

11. The method of claim 9, wherein designating the block as usable by the memory component comprises:
designating the block as a healthy block; and
designating the block as usable by the memory component for storing host data.

12. The method of claim 9, further comprising:
- identifying a behavioral criterion associated with the data loss occurrence in the block of the memory component; and
- incrementing a counter associated with the block in response to the identified behavioral criterion, wherein a value of the counter corresponds to a number of occurrences of a plurality of behavioral criteria causing data loss occurrences in the block,
- wherein the block is designated as the quarantined block responsive to determining that the value of the counter satisfies a first threshold criterion.

13. The method of claim 12, wherein incrementing the counter associated with the block comprises monitoring the behavioral criterion while continuing to designate the block as usable by the memory component for storing host data.

14. The method of claim 12, wherein the behavioral criterion comprises a failure mechanism satisfying a second threshold criterion, the failure mechanism comprising at least one of cross-temperature, program/erase cycles, or read disturb with respect to the block.

15. The method of claim 9, wherein the stress test comprises at least one of cross-temperature test, program/erase cycles test, or read disturb test of the block.

16. The method of claim 9, further comprising:
- determining that the stress test performed on the block of the memory component does not satisfy the testing criterion, the determining comprising:
  - comparing the first stress test result with the stored second stress test result; and
  - determining that the first stress test result of the block is outside an expected variance from the stored second stress test result of the second block.

17. A non-transitory computer-readable storage medium comprising instructions that, when executed by a processing device, cause the processing device to perform operations comprising:
- detecting a data loss occurrence in a block of a memory component;
- designating the block as a quarantined block,
- performing a stress test on the block of the memory component; and
- depending on whether the stress test on the block of the memory component satisfies a testing criterion, either designating the block as usable by the memory component or retiring the block of the memory component, wherein the testing criterion is based on a variance of a first stress test result of the stress test on the block from a stored second stress test result of a second stress test on a second block previously designated as usable by the memory component.

18. The non-transitory computer-readable storage medium of claim 17, wherein designating the block as the quarantined block comprises designating, for a predetermined time period, the block as unusable by the memory component for storing host data.

19. The non-transitory computer-readable storage medium of claim 17, wherein the operations further comprise:
- identifying a behavioral criterion associated with the data loss occurrence in the block of the memory component; and
- incrementing a counter associated with the block in response to the identified behavioral criterion, wherein a value of the counter corresponds to a number of occurrences of a plurality of behavioral criteria causing data loss occurrences in the block,
- wherein the block is designated as the quarantined block responsive to determining that the value of the counter satisfies a first threshold criterion.

20. The non-transitory computer-readable storage medium of claim 19, wherein incrementing the counter associated with the block comprises monitoring the behavioral criterion while continuing to designate the block as usable by the memory component for storing host data.

* * * * *